United States Patent [19]

Mefford

[11] Patent Number: 4,626,787
[45] Date of Patent: Dec. 2, 1986

[54] APPLICATION OF THE PHASELOCK LOOP TO FREQUENCY SYNTHESIS

[75] Inventor: Joseph P. Mefford, Glen Cove, N.Y.

[73] Assignee: Harris Corporation, Melbourne, Fla.

[21] Appl. No.: 708,660

[22] Filed: Mar. 6, 1985

[51] Int. Cl.$^4$ .......................... H03L 7/18; H03L 7/22
[52] U.S. Cl. .......................... 328/14; 331/2; 331/22; 331/39
[58] Field of Search ................. 328/14; 331/2, 22, 39, 331/16

[56] References Cited

U.S. PATENT DOCUMENTS

| | | | |
|---|---|---|---|
| 2,829,255 | 4/1958 | Bolie | 331/39 |
| 3,202,930 | 8/1965 | Muraszko | 331/2 |
| 3,227,963 | 1/1966 | Dimmick | 331/16 |
| 3,235,815 | 2/1966 | Keicher | 331/39 |
| 3,300,731 | 1/1967 | Noyes | 331/2 |
| 3,331,035 | 7/1967 | Strickholm | 328/14 |
| 3,372,347 | 3/1968 | Jones et al. | 231/39 |
| 3,600,699 | 8/1971 | Urenberg | 331/2 |
| 3,838,355 | 9/1974 | Papaieck | 328/14 |
| 4,395,683 | 7/1983 | Connell et al. | 331/2 |

*Primary Examiner*—John S. Heyman
*Attorney, Agent, or Firm*—Scully, Scott, Murphy & Presser

[57] ABSTRACT

A frequency synthesizer is disclosed having n identical digital module stages, each of which stages generates one digit of the final frequency number of the synthesized frequency output signal. Each digit module stage comprises a series arrangement of a phase lock loop, a digit adder, and a digit shifter. The present invention provides a synthesized frequency generator with components that are inexpensive and readily available commercially, and moreover the frequency synthesizer is digitally controllable such that it is compatible with other digital control circuits.

6 Claims, 5 Drawing Figures

FIG.1 - PRIOR ART

APPLICATION OF THE PHASELOCK LOOP TO FREQUENCY SYNTHESIS

BACKGROUND OF THE INVENTION

1. Field of the Invention

The present invention relates generally to a frequency synthesizer, and more particularly pertains to a particular type of frequency synthesizer, specifically one which consists of n identical modules, each of which generates one digit of the final frequency number in hertz, in which a phaselock loop is utilized in such a manner therein as to simplify the synthesizer and to make it less expensive.

2. Discussion of the Prior Art

The precise determination and control of frequencies is increasingly important and necessary in the present continually expanding and improving electronics industry. Stability of operational frequency standards has improved from about $10^{-4}$ in tuning fork types to one part in $10^{10}$ or $10^{11}$ now available with crystal, atomic and molecular frequency sources. Recently developed techniques for long range synchronization employing pulse timing and very low frequency phase comparison allow intercomparison of remote frequency reference sources on a world-wide basis to within a few parts in $10^{10}$.

Precision frequency references are inherently fixed frequency or very narrow band devices. However, operational electronic systems operate at frequencies that span the entire spectrum, and additionally often have to be variable over wide ranges of frequency with stable frequency operation. Moreover in most electronic systems, periodic checking of a variable local oscillator no longer provides a sufficient degree of control. The frequency synthesizer has been developed to fulfill these requirements, and usually by a series of arithmetical operations converts one or more reference frequencies to the desired frequency.

Primary difficulties encountered in the development of satisfactory frequency synthesizers include: attenuation to acceptable levels of unwanted side-bands and modulation components generated in the synthesizer circuits; production of controllable small increments of frequency without generation of difficult-to-filter sidebands; provision for very rapid frequency switching; assurance of a very high degree of inherent reliability; and often the circuits utilized many relatively expensive components such as crystal filters.

Phase locked loops (PLL) are also well known in the art, and have often been implemented in frequency synthesizers. However, phase locked loop oscillators were often intentionally not utilized in the prior art in order to be able to generate very pure signals and to achieve high speed switching from one frequency to another in about 200 usec.

A particular prior art frequency synthesizer of interest employs n identical digital modules, each of which generates one digit of the final frequency number of the frequency of the synthesized output signal. Each digit module has ten reference frequencies available to it. This type of frequency synthesizer can comprise any number of digit modules, depending generally upon the number of digits in the synthesized frequency output signal. U.S. patents to Muraszko U.S. Pat. No. 3,202,930, Dimmick, U.S. Pat. No. 3,227,963, Noyes, Jr., U.S. Pat. No. 3,300,731, and Connell, et al. U.S. Pat. No. 4,395,683 each disclose this same general type of frequency synthesizer having n identical digit modules, each having a PLL therein, and each is distinguishable from the present invention as each digit module therein requires ten input reference frequencies available for selection, rather than one reference frequency and a controlled divide-by-n counter, as in the present invention.

Orenberg U.S. Pat. No. 3,600,699 is of particular interest to the present invention as disclosing a similar type of frequency synthesizer which is pertinent thereto. In this reference, each digit module generates a particular frequency by one reference frequency and a digitally controlled divide-by-n counter. However, Orenberg is also quite different from the present invention as, in each digit module, the PLL combines the functions of both the first digit adder and the second digit adder in one very complex PLL. Thus, in Orenberg, a reference signal is mixed in a mixer with the output of a VCO, and the output of the mixer is filtered to obtain only the difference frequency, which is directed to a variable divide-by-n counter, and the phase of the resultant signal is compared in a phase comparator with the phase of a second input reference signal. The output of the phase comparator is filtered, and then drives the VCO to the proper frequency for that digit module. In contrast therewith, the present invention proposes to replace only the first digit adder with a PLL, and the second digit adder (with its mixer, filter and input second reference frequency) remains as a separate circuit, which is not a part of the much simpler PLL.

SUMMARY OF THE INVENTION

Accordingly, it is a primary object of the present invention to provide a synthesized frequency generator with components that are inexpensive and readily available commercially.

A further object of the subject invention is the provision of a frequency synthesizer which is digitally controllable such that it is compatible with other digital control circuits.

An additional object of the present invention is the provision of a frequency synthesizer of the type having n identical digital module stages, each of which utilizes an inexpensive and readily available commercial PLL loop in place of more expensive components such as crystal filters, mixer amplifiers, selector switches and reference frequency sources providing a large plurality of reference frequencies. A PLL would in general be less expensive than the components it replaces, particularly since most PLL components are available as integrated circuits. The use of a PLL as disclosed and taught herein also eliminates the requirement for the generation of ten relatively high frequency harmonics, which requires considerable hardware and care to prevent these frequencies from interfering with other signals, and subsequently degrading the spectral purity of the synthesizer output signal. Moreover the output filter of the first digit adder is eliminated, which is normally a relatively expensive crystal filter because of the requisite high Q.

In accordance with the teachings herein, the present invention provides a frequency synthesizer having n identical digital module stages, each of which stages generates one digit of the final frequency number of the synthesized frequency output signal. Moreover, each identical digital module stage comprises a series arrangement of a phase lock loop, a digit adder, and a digit shifter.

The phase lock loop receives only a single input reference frequency signal from a reference signal generator, which is directed to a phase comparator as an input thereto. The phase comparator compares the reference frequency signal with a signal generated within the phase lock loop to produce a phase error signal. A variable frequency oscillator receives the phase error signal as an input, and generates an output frequency signal for that digital module stage. A digit control circuit, which in an exemplary embodiment is a divide-by-n counter, is coupled to receive the output frequency signal, and also receives a digit control input signal which determines the digit contribution of that particular digit module stage to the final frequency number of the synthesized frequency output signal. The output of the divide-by-n counter is then directed as a second input signal to the phase comparator, which compares it with the reference frequency signal to generate the phase error signal, such that the digit control input signal determines the output frequency signal for that particular digit module stage.

The digit adder is coupled to receive as inputs the output of the phase lock loop and the output frequency signal from the previous digit module stage, except for the first digit module stage, and produces a digit adder output signal. The digit adder output signal is directed to a digit shifter, which produces a shifted digit output signal as the output signal for that digit module stage. The shifted digit output signal is then directed as an input signal to the digit adder of the subsequent digit module stage, or for the last digit module stage forms the synthesized frequency output signal of the frequency synthesizer.

In greater detail, each divide-by-n counter is a digitally controlled divide-by-n counter receiving a digital input control signal, such that the frequency synthesizer is compatible with other digital control circuits capable of producing the digital input digit control signals. Moreover, in a preferred embodiment each digit module stage further includes an amplifier and loop filter coupled between the phase comparator and the variable frequency oscillator. The phase comparator produces a voltage output error signal, and the amplifier and loop filter produce a control voltage output signal. The variable frequency generator is a voltage controlled oscillator(VCO), and responds to the control voltage output signal to produce the output frequency signal for that digit module stage. Moreover, each digit shifter comprises a divide-by-ten digit shifter circuit, and also includes an output filter for that digit module stage.

BRIEF DESCRIPTION OF THE DRAWINGS

The foregoing objects and advantages of the present invention for a frequency synthesizer may be more readily understood by one skilled in the art with reference being had to the following detailed description of a preferred embodiment thereof, taken in conjunction with the accompanying drawings wherein like elements are designated by identical reference numerals throughout the several views, and in which.

DETAILED DESCRIPTION OF THE DRAWINGS

Figure 1:
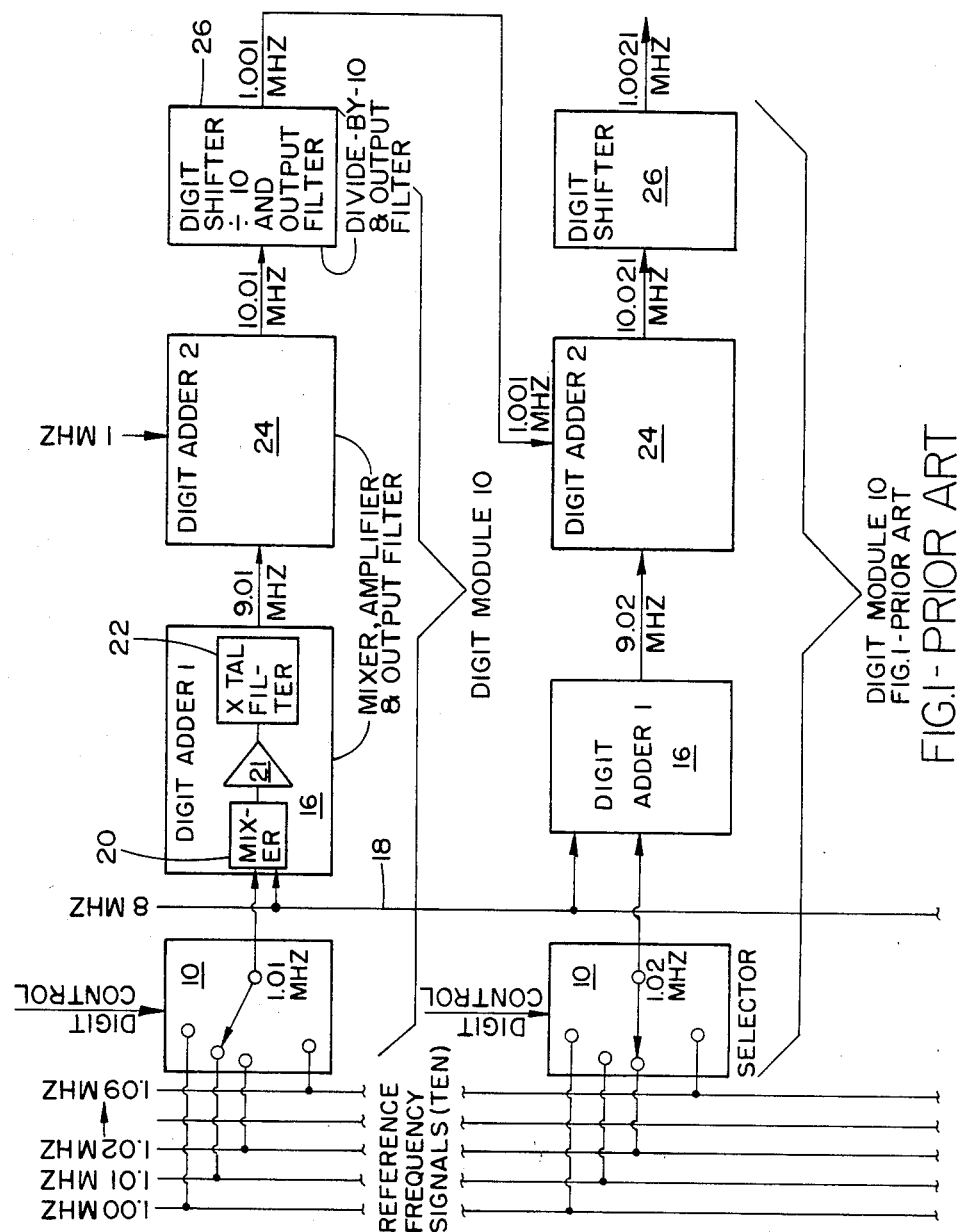
FIG. 1 is an exemplary block diagram of a prior art frequency synthesizer having n identical digit modules.

Referring to the drawings in detail, FIG. 1 illustrates a prior art frequency synthesizer of the type having n identical digital modules, each of which generates one digit of the final frequency number of the frequency of the synthesized output signal.

The current state of the art of frequency generators and synthesizers utilizes several digit modules 10, two of which are illustrated in FIG. 1. Each digit module 10 has ten reference frequencies (1.00 to 1.09 MHz in 0.01 MHz steps)available to it. The ten reference frequencies can be generated in any convenient manner, and are typically filtered at the reference frequencies. The frequency synthesizer can comprise any number of digit modules 10, depending generally upon the number of digits in the synthesized frequency output signal.

Figure 2:
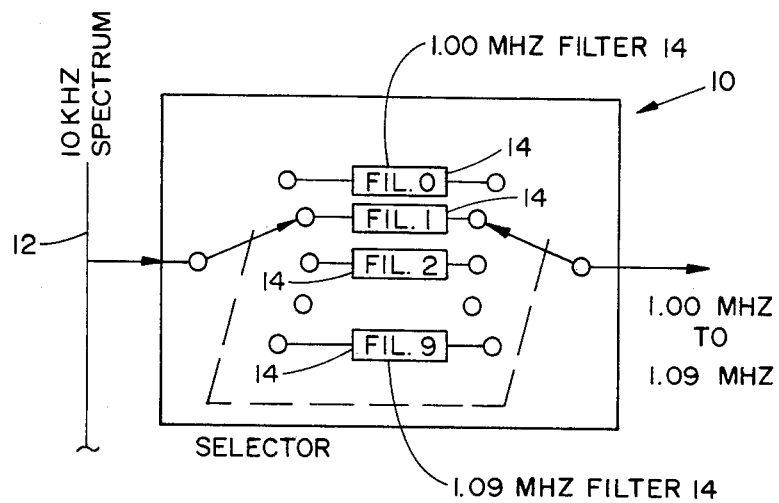
FIG. 2 illustrates in greater detail a typical prior art input selector digit control switch.

One of the ten reference frequencies is selected by a digit selector 10, which can be an electronic or a mechanical switch, or a combination thereof, possibly with filters, depending on the manner that the reference frequencies are presented (i.e., one frequency per wire or one wire with all of the harmonics on it). FIG. 2 illustrates a prior art selector of the latter type having one input line 12 and a plurality of selective filters 14.

The selected frequency is presented to a first digit adder 16 together with an 8 MHz signal on input line 18. A frequency mixer 20 therein produces the sum and difference of the two frequencies, plus the sum and difference of whatever haromonics of the input frequencies are present. The selected frequency, which for the purpose of illustration, is 1.01 MHz, is added to the 8 $MH_z$ to produce a 9.01 MHz sum signal. This signal is amplified at 21, and is passed by filter 22, typically a crystal filter, onto a second digit adder 24, while the difference frequency, 6.99 MHz, together with all other undesired frequency mixing products, are blocked by filter(s) 22.

The second digit adder 24 receives an input reference signal at 1 MHz, and is essentially the same as the first digit adder 16 with at least one exception. The filter(s) therein must pass 10.01 MHz signals and block 8.01 MHz signals. The output of the second digit adder 10 is then passed to a digit shifter 26, which typically includes a divide-by-ten circuit and an output filter.

The circuit of FIG. 1 illustrates generally how each digit module contributes a decimal digit to the final frequency number in this known prior art approach. A useful feature of a digit module frequency synthesizer is that arbitrarily fine resolution can be obtained by adding more digit modules. These can be added in the direction of the least significant digit direction. Another advantageous feature is that all of the digit modules are substantially identical, thereby simplifying the construction of the overall frequency synthesizer circuit.

The present invention concerns an improvement in one particular type of frequency synthesizer, as illustrated in FIGS. 1 and 2, specifically one consisting of n identical digit modules, each of which generates one digit of the final frequency number in hertz. The present invention essentially teaches the use of a phase-lock loop (PLL) in place of the selector 10 and the first digit adder 16. One reference frequency (e.g. 10 KHz) is directed as an input to the PLL, rather than ten as in the prior art, and the particular output frequency for the PLL is chosen in accordance with a digital input signal to a digitally controlled divide-by-n counter, such that the digital input signal controls the digit supplied by that digit module to the synthesized frequency output signal.

The advantages of the PLL circuit relative to the prior art approach of FIGS. 1 and 2 are:

the PLL circuit 30 would in general be less expensive than the two blocks 10 and 16 that it replaces, especially now that most commercially available PLL components are integrated circuits;

the use of the PLL circuit 30 eliminates the requirement for the generation of ten relatively high frequency harmonics. The more frequencies produced, the more hardware and care that is required to prevent these frequencies from interfering with other signals and subsequently degrading the spectral purity of the synthesizer output signal; and the crystal output filter of the first digit adder 16 is eliminated. This is a relatively expensive filter because it must pass 9.00 to 9.09 MHz while rejecting frequencies of from 6.91 to 7.00 MHz to a high degree. The filter is most likely of the crystal type to obtain the high Q necessary.

Figure 3:
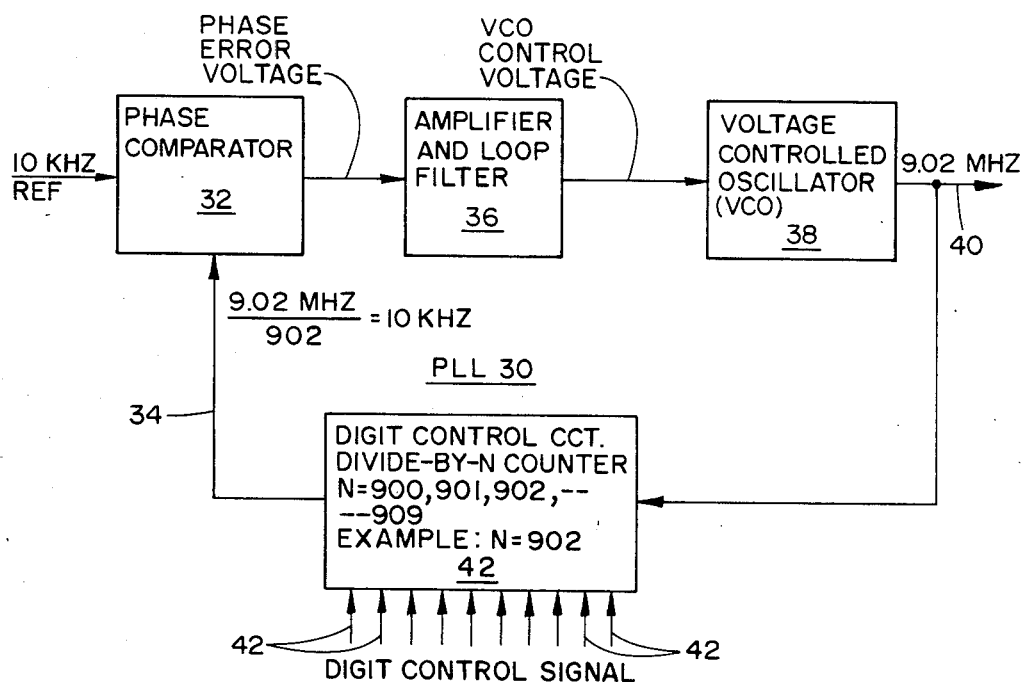
FIG. 3 illustrates an exemplary block diagram of a phase lock loop (PLL) circuit, as can be utilized in the embodiment of FIG. 4.
Figure 4:
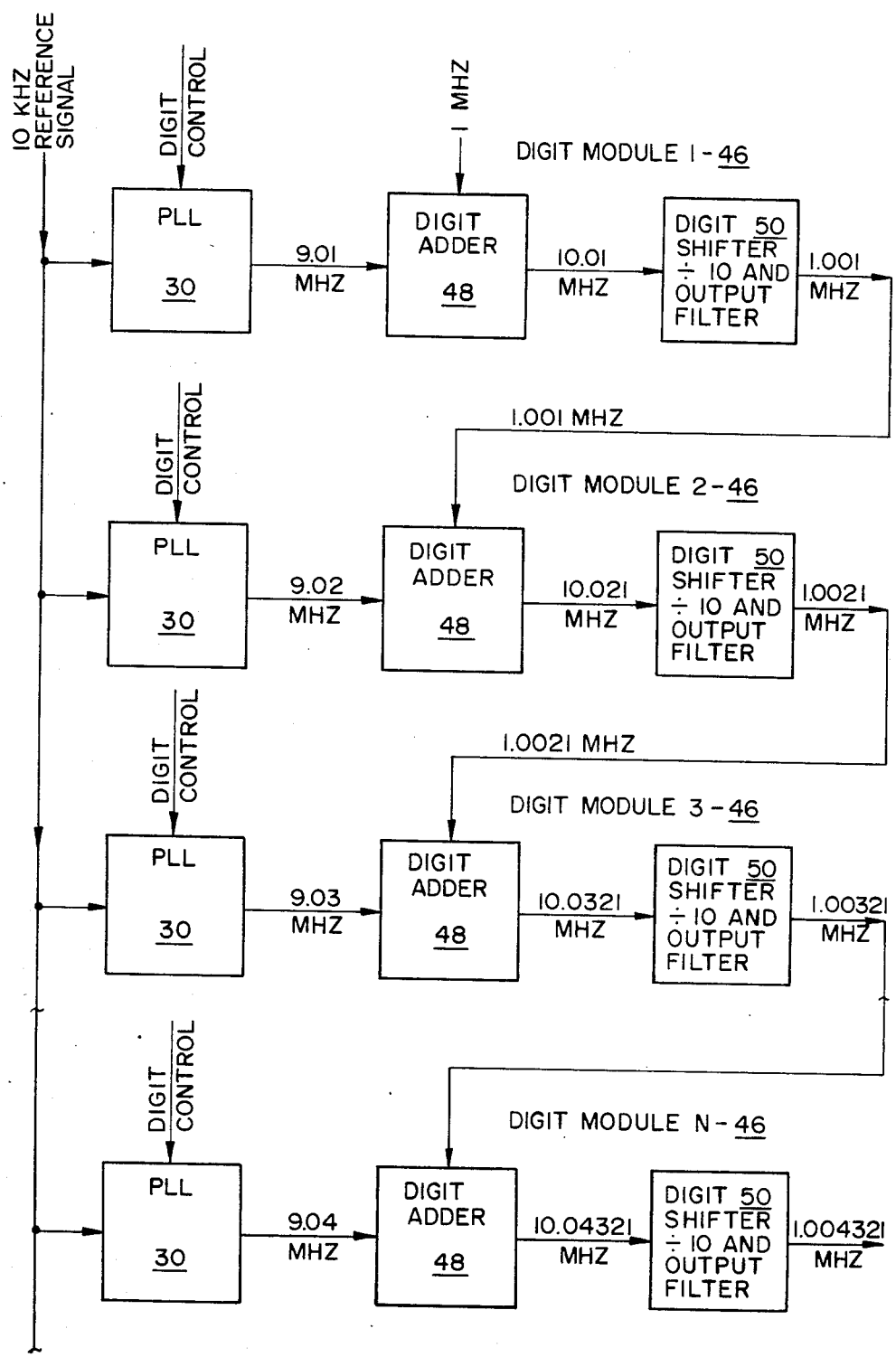
FIG. 4 is an exemplary block diagram of a frequency synthesizer constructed pursuant to the teachings of the present invention.

FIG. 3 illustrates a PLL circuit 30, which would be suitable for use in the present invention in a manner as illustrated in FIG. 4. In this exemplary embodiment the PLL circuit 30 is programmable from 9.00 to 9.09 MHz in 0.01 MHz steps where these output frequencies correspond to the frequencies out of the first digit adder 16 of the prior art synthesizer.

The exemplary phase lock loop 30 receives only a single input reference frequency signal (e.g. 10 KHz) from a reference signal generator, not shown, which is directed to a phase comparator 32 as a first input thereto. The phase comparator 32 compares the reference frequency signal with a signal on line 34 generated within the phase lock loop to produce an output phase error signal. A variable frequency oscillator 38 receives the phase error signal, after processing through an amplifier and loop filter 36, as an input, and generates an output frequency signal (e.g. 9.02 MHz) for that digital module stage on line 40. A digit control circuit 42, which in the exemplary embodiment is a divide-by-n counter, is coupled to receive the output frequency signal on line 40, and also receives a digit control input signal on line (s) 42, which determines the digit contribution of that particular digit module stage to the final frequency number of the synthesized frequency output signal. The output of the divide-by-n counter 42 is then directed as a second input signal to the phase comparator 32, which compares it with the reference frequency signal (e.g. 10 KHz) to generate the phase error signal, such that the digit control input signal determines the output frequency signal for that particular digit module stage.

In greater detail, in a preferred embodiment each divide-by-n counter 42 is a digitally controlled divide-by-n counter receiving a digital input control signal on line or lines 42, such that a frequency synthesizer as taught by the present invention is compatible with other digital control circuits capable of producing the digital input digit control signals. A digitally controlled divide-by-n counter represents a relatively simple and advantageous form of the digit control circuit 42, although alternative embodiments of the digit control circuit 42 might also be utilized pursuant to the teachings herein. Moreover, in a preferred embodiment the phase comparator produces a voltage output error signal, and the amplifier and loop filter 36 produce a control voltage output signal. The variable frequency generator 38 is a voltage controlled oscillator (VCO), and responds to the control voltage output signal to produce the output frequency signal for that digit module stage.

Referring to FIG. 4 in greater detail, in accordance with the teachings herein, the present invention provides a frequency synthesizer having n identical digital module stages 46, each of which stages generates one digit of the final frequency number of the synthesized frequency output signal. Pursuant to the teachings herein, each identical digital module stage 46 comprises a series arrangement of a phase lock loop 30, a digit adder 48, and a digit shifter 50. The digit adder 48 and digit shifter 50 are preferably of the same design as the second digit adder 24 and digit shifter 26 of the frequency synthesizer of FIG. 1.

The digit adder 48 is coupled to receive as inputs the output of the phase lock loop 30 and the output frequency signal from the previous digit module stage, except for the first digit module stage which receives a reference signal input (e.g. 1 HMz), and produces a digit adder output signal. The digit adder output signal is directed to the digit shifter 50, which produces a shifted digit output signal as an output signal for that digit module stage. The shifted digit output signal is then directed as an input signal to the digit adder 48 of the subsequent digit module stage, or for the last digit module stage forms the synthesized frequency output signal of the frequency synthesizer (e.g. 1.004321 HMz).

The frequency synthesizer can comprise any number of digit modules 10, depending generally upon the number of digits in the synthesized frequency output signal, and the four stage illustrated embodiments should be considered as only exemplary in nature. Moreover, the particular frequencies of the illustrated embodiment are also exemplary in nature, and other frequencies could be implemented in alternative embodiments, subject to the considerations mentioned herein.

Figure 5:
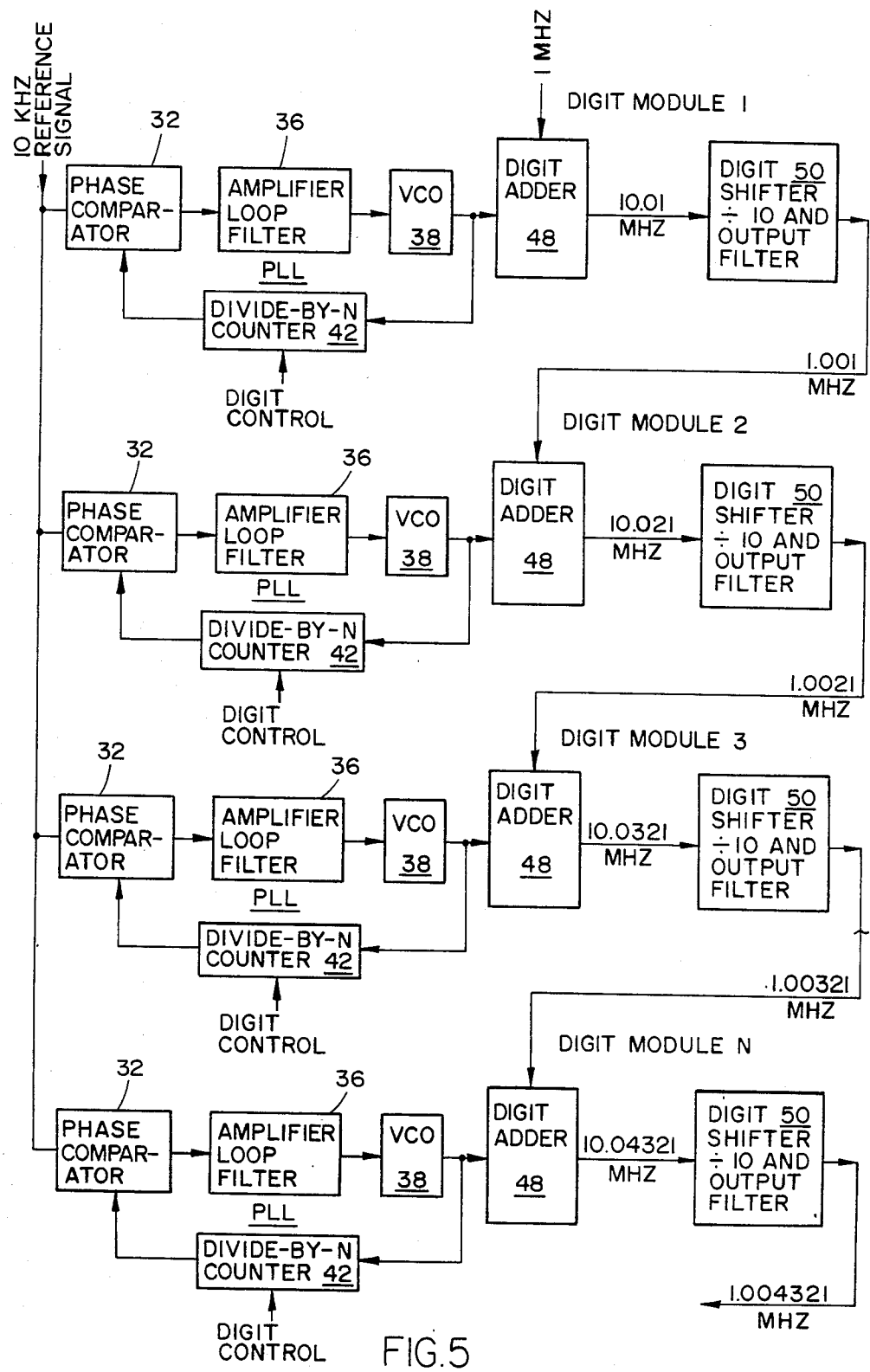
FIG. 5 is a block diagram similar to FIG. 4, but showing additional details of each phase lock loop in each digit module stage.

FIG. 5 is a block diagram similar to FIG. 4, but illustrating additional details of each phase lock loop in each digit module stage, pursuant to the components previously explained with reference to FIG. 3.

While an exemplary embodiments and several variations of the present invention for a frequency synthesizer are described in detail herein, it should be apparent that the disclosure and teachings of the present invention will suggest many alternative designs to those skilled in the art.

What is claimed is:

1. A frequency synthesizer for generating a synthesized frequency output signal, said frequency synthesizer having n substantially identical digital module, stages, each of which stages generates one digit of the final frequency number of the synthesized frequency output signal, wherein each digital module stage comprises:

a. a phase lock loop receiving only a single input reference frequency signal from a reference signal generator, said phase lock loop comprising:

i. a phase comparator receiving said single input reference signal as an input thereto, and generating a phase error signal, ii. a variable frequency oscillator coupled to receive the phase error signal as an input, and generating an output frequency signal for that digital module stage, iii. a digit control circuit means coupled to receive the output frequency signal as an input, said digit control circuit means also receiving a digit control input signal which determines the digit contribution of that digit module stage to the final frequency number of the synthesized frequency output signal, and the output of the digit control circuit means being directed as a second input signal to said phase comparator, which compares it with said reference frequency signal to generate the phase error signal, whereby the digit control input signal determines the output frequency signal for that module stage;

b. a digit adder, except the one associated with the first module stage, coupled to receive the output frequency signal from said phase lock loop output and the previous digit module stage as inputs thereto, the digit adder associated with said first stage receiving said phase lock loop output and a reference frequency signal input and producing a digit adder output signal; and c. a digit shifter coupled to receive the digit adder output signal as an input thereto, and producing a shifted digit output signal as an output signal for that digit module stage, which is directed as an input signal to the digit adder of the subsequent digit module stage, or for the last digit module stage forms the synthesized frequency output signal for the frequency synthesizer.

2. A frequency synthesizer as claimed in claim 1, each digit control circuit means comprising a divide-by-n counter receiving a digital input digit control signal, whereby the frequency synthesizer is compatible with other digital control circuits producing the digital input digit control signals.

3. A frequency synthesizer as claimed in claim 2, each divide-by-n counter comprising a digitally controlled divide-by-n counter receiving a digital input digit control signal, whereby the frequency synthesizer is compatible with other digital control circuits producing the digital input digit control signals.

4. A frequency synthesizer as claimed in claim 3, each digit module stage further comprising an amplifier and loop filter serially coupled between the phase comparator and the variable frequency oscillator.

5. A frequency synthesizer as claimed in claim 4, each phase comparator producing a phase error voltage output signal, each amplifier and loop filter producing a control voltage output signal, and each variable frequency generator comprising a voltage controlled oscillator responding to the control voltage output signal to produce the output frequency signal for that digit module stage.

6. A frequency synthesizer as claimed in claim 5, each digit shifter comprising a divide-by-ten digit shifter circuit, and an output filter for the digit module stage.

* * * * *